US010147485B2

(12) United States Patent
Hecht

(10) Patent No.: US 10,147,485 B2
(45) Date of Patent: Dec. 4, 2018

(54) CIRCUITS AND METHODS FOR PREVENTING OVER-PROGRAMMING OF RERAM-BASED MEMORY CELLS

(71) Applicant: Microsemi SoC Corp., San Jose, CA (US)

(72) Inventor: Volker Hecht, Barsinghausen (DE)

(73) Assignee: Microsemi SoC Corp., San Jose, CA (US)

( * ) Notice: Subject to any disclaimer, the term of this patent is extended or adjusted under 35 U.S.C. 154(b) by 0 days.

(21) Appl. No.: 15/714,562

(22) Filed: Sep. 25, 2017

(65) Prior Publication Data

US 2018/0108409 A1    Apr. 19, 2018

Related U.S. Application Data

(60) Provisional application No. 62/401,880, filed on Sep. 29, 2016.

(51) Int. Cl.
*G11C 11/00* (2006.01)
*G11C 13/00* (2006.01)

(52) U.S. Cl.
CPC ...... *G11C 13/0059* (2013.01); *G11C 13/0023* (2013.01); *G11C 13/0069* (2013.01); *G11C 13/0097* (2013.01); *G11C 2013/009* (2013.01); *G11C 2013/0066* (2013.01); *G11C 2213/15* (2013.01); *G11C 2213/79* (2013.01)

(58) Field of Classification Search
CPC .................................................. G11C 13/0002
USPC ........................................................ 365/148
See application file for complete search history.

(56) References Cited

U.S. PATENT DOCUMENTS

| | | |
|---|---|---|
| 4,758,745 A | 7/1988 | Elgamal et al. |
| 4,873,459 A | 10/1989 | Gamal et al. |
| 4,904,338 A | 2/1990 | Kozicki |
| 5,229,963 A | 7/1993 | Ohtsuka et al. |
| 5,254,866 A | 10/1993 | Ogoh |
| 5,314,772 A | 5/1994 | Kozicki et al. |
| 5,463,583 A | 10/1995 | Takashina |
| 5,500,532 A | 3/1996 | Kozicki |
| 5,537,056 A | 7/1996 | McCollum |
| 5,542,690 A | 8/1996 | Kozicki |
| 5,557,137 A | 9/1996 | Cohen |
| 5,576,568 A | 11/1996 | Kowshik |
| 5,587,603 A | 12/1996 | Kowshik |
| 5,625,211 A | 4/1997 | Kowshik |
| 5,682,389 A | 10/1997 | Nizaka |

(Continued)

OTHER PUBLICATIONS

PCT/US2017/062878 International Search Report and Written Opinion, dated Mar. 28, 2018.

(Continued)

*Primary Examiner* — Hoai V Ho
(74) *Attorney, Agent, or Firm* — Glass & Associates; Kenneth D'Alessandro; Kenneth Glass

(57) ABSTRACT

A method for preventing over-programming of resistive random access (ReRAM) based memory cells in a ReRAM memory array includes applying a programming voltage in a programming circuit path including a ReRAM memory cell to be programmed, sensing programming current drawn by the ReRAM cell while the programming voltage is applied across the memory cell, and decreasing the programming current as a function of a rise in programming current.

8 Claims, 7 Drawing Sheets

(56) References Cited

U.S. PATENT DOCUMENTS

| | | |
|---|---|---|
| 5,729,162 A | 3/1998 | Rouy |
| 5,761,115 A | 6/1998 | Kozicki et al. |
| 5,770,885 A | 6/1998 | McCollum |
| 5,801,415 A | 9/1998 | Lee et al. |
| 5,812,452 A | 9/1998 | Hoang |
| 5,896,312 A | 4/1999 | Kozicki et al. |
| 5,914,893 A | 6/1999 | Kozicki et al. |
| 5,986,322 A | 11/1999 | McCollum et al. |
| 6,063,663 A | 5/2000 | Caprara et al. |
| 6,084,796 A | 7/2000 | Kozicki et al. |
| 6,100,560 A | 8/2000 | Lovett |
| 6,137,725 A | 10/2000 | Tassan et al. |
| 6,144,580 A | 11/2000 | Murray |
| 6,222,774 B1 | 4/2001 | Tanzawa et al. |
| 6,324,102 B1 | 11/2001 | McCollum |
| 6,326,651 B1 | 12/2001 | Manabe |
| 6,348,365 B1 | 2/2002 | Moore et al. |
| 6,356,478 B1 | 3/2002 | McCollum |
| 6,388,324 B2 | 5/2002 | Kozicki |
| 6,418,049 B1 | 7/2002 | Kozicki et al. |
| 6,437,365 B1 | 8/2002 | Hawley et al. |
| 6,469,364 B1 | 10/2002 | Kozicki |
| 6,487,106 B1 | 11/2002 | Kozicki |
| 6,635,914 B2 | 10/2003 | Kozicki et al. |
| 6,709,887 B2 | 3/2004 | Moore et al. |
| 6,768,687 B2 | 7/2004 | Kaihatsu |
| 6,784,476 B2 | 8/2004 | Kim et al. |
| 6,798,692 B2 | 9/2004 | Kozicki et al. |
| 6,815,784 B2 | 11/2004 | Park et al. |
| 6,825,489 B2 | 11/2004 | Kozicki |
| 6,847,073 B2 | 1/2005 | Kanaya |
| 6,849,891 B1 | 2/2005 | Hsu et al. |
| 6,864,500 B2 | 3/2005 | Gilton |
| 6,865,117 B2 | 3/2005 | Kozicki |
| 6,891,769 B2 | 5/2005 | McCollum et al. |
| 6,914,802 B2 | 7/2005 | Kozicki |
| 6,927,411 B2 | 8/2005 | Kozicki |
| 6,940,745 B2 | 9/2005 | Kozicki |
| 6,955,940 B2 | 10/2005 | Campbell et al. |
| 6,970,383 B1 | 11/2005 | Han et al. |
| 6,985,378 B2 | 1/2006 | Kozicki |
| 6,998,312 B2 | 2/2006 | Kozicki et al. |
| 7,006,376 B2 | 2/2006 | Kozicki |
| 7,061,036 B2 | 6/2006 | Kajiyama |
| 7,078,295 B2 | 7/2006 | Jeon et al. |
| 7,101,728 B2 | 9/2006 | Kozicki et al. |
| 7,120,053 B2 | 10/2006 | Atsumi et al. |
| 7,120,079 B2 | 10/2006 | McCollum et al. |
| 7,126,837 B1 | 10/2006 | Banachowicz et al. |
| 7,142,450 B2 | 11/2006 | Kozicki et al. |
| 7,145,794 B2 | 12/2006 | Kozicki |
| 7,169,635 B2 | 1/2007 | Kozicki |
| 7,180,104 B2 | 2/2007 | Kozicki |
| 7,187,610 B1 | 3/2007 | McCollum et al. |
| 7,227,169 B2 | 6/2007 | Kozicki |
| 7,232,717 B1 | 6/2007 | Choi et al. |
| 7,245,535 B2 | 7/2007 | McCollum et al. |
| 7,288,781 B2 | 10/2007 | Kozicki |
| 7,294,875 B2 | 11/2007 | Kozicki |
| 7,301,821 B1 | 11/2007 | Greene et al. |
| 7,339,232 B2 | 3/2008 | Seo et al. |
| 7,368,789 B1 | 5/2008 | Dhaoui et al. |
| 7,372,065 B2 | 5/2008 | Kozicki et al. |
| 7,385,219 B2 | 6/2008 | Kozicki et al. |
| 7,402,847 B2 | 7/2008 | Kozicki et al. |
| 7,405,967 B2 | 7/2008 | Kozicki et al. |
| 7,430,137 B2 | 9/2008 | Greene et al. |
| 7,499,360 B2 | 3/2009 | McCollum et al. |
| 7,511,532 B2 | 3/2009 | Derharcobian et al. |
| 7,519,000 B2 | 4/2009 | Caveney et al. |
| 7,560,722 B2 | 7/2009 | Kozicki |
| 7,675,766 B2 | 3/2010 | Kozicki |
| 7,692,972 B1 | 4/2010 | Sadd et al. |
| 7,728,322 B2 | 6/2010 | Kozicki |
| 7,763,158 B2 | 7/2010 | Kozicki |
| 7,816,717 B2 | 10/2010 | Ozaki |
| 7,839,681 B2 | 11/2010 | Wang et al. |
| 7,928,492 B2 | 4/2011 | Jeon et al. |
| 7,929,345 B2 | 4/2011 | Issaq |
| 8,269,203 B2 | 9/2012 | Greene et al. |
| 8,269,204 B2 | 9/2012 | Greene et al. |
| 8,415,650 B2 | 4/2013 | Greene et al. |
| 8,531,866 B2 | 9/2013 | Ikegami et al. |
| 8,735,211 B2 | 5/2014 | Greeley et al. |
| 9,128,821 B2 | 9/2015 | Chen et al. |
| 9,704,573 B1 | 7/2017 | Hecht |
| 2002/0003247 A1 | 1/2002 | Yokoyama et al. |
| 2003/0107105 A1 | 6/2003 | Kozicki |
| 2003/0222303 A1 | 12/2003 | Fukuda |
| 2004/0124407 A1 | 7/2004 | Kozicki et al. |
| 2005/0141431 A1 | 6/2005 | Caveney et al. |
| 2005/0225413 A1 | 10/2005 | Kozicki et al. |
| 2006/0028895 A1 | 2/2006 | Taussig et al. |
| 2006/0050546 A1 | 3/2006 | Roehr |
| 2006/0051927 A1 | 3/2006 | Takami |
| 2006/0086989 A1 | 4/2006 | Lee et al. |
| 2006/0171200 A1 | 8/2006 | Rinerson et al. |
| 2006/0230375 A1 | 10/2006 | Casey et al. |
| 2006/0238185 A1 | 10/2006 | Kozicki |
| 2006/0291364 A1 | 12/2006 | Kozicki |
| 2007/0045728 A1 | 3/2007 | Lee |
| 2007/0075352 A1 | 4/2007 | Irie |
| 2007/0108508 A1 | 5/2007 | Lin et al. |
| 2007/0109861 A1 | 5/2007 | Wang et al. |
| 2007/0121369 A1 | 5/2007 | Happ |
| 2007/0146012 A1 | 6/2007 | Murphy |
| 2007/0165446 A1 | 7/2007 | Oliva et al. |
| 2007/0165532 A1 | 7/2007 | Retana et al. |
| 2008/0101117 A1 | 5/2008 | Ogura et al. |
| 2008/0113560 A1 | 5/2008 | Caveney et al. |
| 2008/0211540 A1 | 9/2008 | Fujita |
| 2008/0279028 A1 | 11/2008 | McCollum et al. |
| 2009/0034325 A1 | 2/2009 | Lowrey et al. |
| 2009/0184359 A1 | 7/2009 | He et al. |
| 2009/0198812 A1 | 8/2009 | Caveney et al. |
| 2009/0283740 A1 | 11/2009 | Kozicki et al. |
| 2010/0092656 A1 | 4/2010 | Kozicki |
| 2010/0100857 A1 | 4/2010 | Chen et al. |
| 2010/0135071 A1 | 6/2010 | Kozicki |
| 2010/0149873 A1 | 6/2010 | Wang et al. |
| 2010/0157688 A1 | 6/2010 | Issaq |
| 2010/0169886 A1 | 7/2010 | Troxel et al. |
| 2010/0208520 A1 | 8/2010 | Wang et al. |
| 2011/0001108 A1 | 1/2011 | Greene et al. |
| 2011/0001115 A1 | 1/2011 | Greene et al. |
| 2011/0001116 A1 | 1/2011 | Greene |
| 2011/0002167 A1 | 1/2011 | McCollum |
| 2011/0024821 A1 | 2/2011 | Wang et al. |
| 2011/0205780 A1 | 8/2011 | Yasuda et al. |
| 2012/0223381 A1 | 9/2012 | Lu et al. |
| 2013/0033921 A1 | 2/2013 | Tsuda et al. |
| 2013/0134378 A1 | 5/2013 | Liu |
| 2013/0234100 A1 | 9/2013 | An et al. |
| 2014/0071745 A1 | 3/2014 | Kawasumi |
| 2014/0151621 A1 | 6/2014 | Tendulkar |
| 2014/0158968 A1 | 6/2014 | Jo |
| 2014/0175531 A1 | 6/2014 | Huang et al. |
| 2014/0233301 A1 | 8/2014 | Lu et al. |
| 2014/0246719 A1 | 9/2014 | Dhaoui |
| 2014/0264238 A1 | 9/2014 | Jo |
| 2014/0269008 A1 | 9/2014 | Baker, Jr. |
| 2015/0188039 A1 | 2/2015 | Wang |
| 2015/0076439 A1 | 3/2015 | Saitoh et al. |
| 2016/0133837 A1 | 12/2016 | Hsueh |
| 2017/0345496 A1* | 11/2017 | Liu .................. G11C 13/0069 |

OTHER PUBLICATIONS

Aratani, et al., Aratani, K. "A Novel Resistance Memory with High Scalability and Nanosecond Switching," IEDM, 2007, pp. 783-786.

Baek, et al., Baek, I. G. et al., "Highly Scalable Non-volatile Resistive Memory using Simple Binary Oxide Driven by Asym

(56) References Cited

OTHER PUBLICATIONS metric Uni-polar Voltage Pulses, Samsung Advanced Institute of Technology," IDEM 2004, 26 pages.
Burr, Burr, G. W. et al., "Overview of Candidate Device Technologies for Storage-class Memory," IBM Journal of Research & Development, 2008, vol. 52, No. 4/5, pp. 449-464.
Choi, et al., Choi, S. J. et al., "Improvement of CBRAM Resistance Window by Scaling Down Electrode Size in Pure-GeTe Film," IEEE Electron Device Letters, Feb. 2009, vol. 30, No. 2, pp. 120-122.
Fang, et al., Fang, T. N. et al, "Erase Mechanism for Copper Oxide Resistive Switching Memory Cells with Nickel Electrode," Int'l Electron Devices Meeting, 2006, pp. 1-4.
Greene, et al., Greene, Jonathan et al., "Antifuse Field Programmable Gate Arrays," Proceedings of the IEEE, Jul. 1993, vol. 81, No. 7, pp. 1042-1056.
Kund, et al., Kund, Michael et al., "Conductive Bridging RAM (CBRAM): An Emerging Non-volatile Memory Technology Scalable to Sub 20nm," IEDM Technical Digest, Dec. 5, 2005, pp. 754-757, held in Washington, D.C.
Lemieux, et al., Lemieux, G. et al., "Directional and Single-Driver Wires in FPGA Interconnect," International Conference on Field-Programmable Technology (ICFPT), Dec. 2004, pp. 41-48, Brisbane, Australia.
Meyer, Meyer, R., "Scalable Non-volatile Cross-point Memory Based on Dual-layer Oxide Memory Elements," 9th Annual Non-volatile Memory Technology Symposium, Nov. 11-14, 2008, in Pacific Grove, CA, Unity Semiconductor Corporation, Sunnyvale, CA 94085, 41 pp.
Meyer, et al., Meyer, R. et al., "Oxide Dual-layer Memory Element for Scalable Non-volatile Cross-point Memory Technology," 9th Annual Non-volatile Memory Technology Symposium, Nov. 11-14, 2008, in Pacific Grove, CA, pp. 1-5.
Sakamoto, et al., Sakamoto, T. et al., "A /Ta2O5 Solid-Electrolyte Switch with Improved Reliabiltiy," 2007 IEEE Symposium on VLSI Technogy, Jun. 12-14, 2007, pp. 38-39, held in Kyoto, JP.
Strukov, et al., Strukov, Dimitri B. et al., "The Missing Memristor Found," Nature, May 1, 2008, vol. 453, pp. 80-85.
Symanczyk, Symanczyk, Ralf, "Conductive Bridging Memory Devleopment from Single Cells to 2Mbit Memory Arrays," 8th Non-Volatile Memory Technology Symposium, Nov. 10-13, 2007, 25 pages.
PCT/US2016/066955, Notification of Transmittal of the International Search Report and the Written Opinion of the International Searching Authority, or the Declaration, Form PCT/ISA/220.
PCT/US2016/066967, Notification of Transmittal of the International Search Report and the Written Opinion of the International Searching Authority, or the Declaration, Form PCT/ISA/220.
Wei Yi et al: Feedback write scheme for memristive switching devices 11, Applied Physics A• Materials Science & Processing, Springer, Berlin, DE, vol. 102, No. 4, Jan. 27, 2011 (Jan. 27, 2011), pp. 973-982.
Yi-Chung Chen et al: "The 3-D Stacking Bipolar RRAM for High Density", IEEE Transactions on Nanotechnology, IEEE Service Center, Piscataway, NJ, US, vol. 11, No. 5, Sep. 1, 2012 (Sep. 1, 2012), pp. 948-956.
International Search Report and Written Opinion of the International Searching Authority dated Dec. 19, 2017, International application No. PCT/US2017/054174.

\* cited by examiner

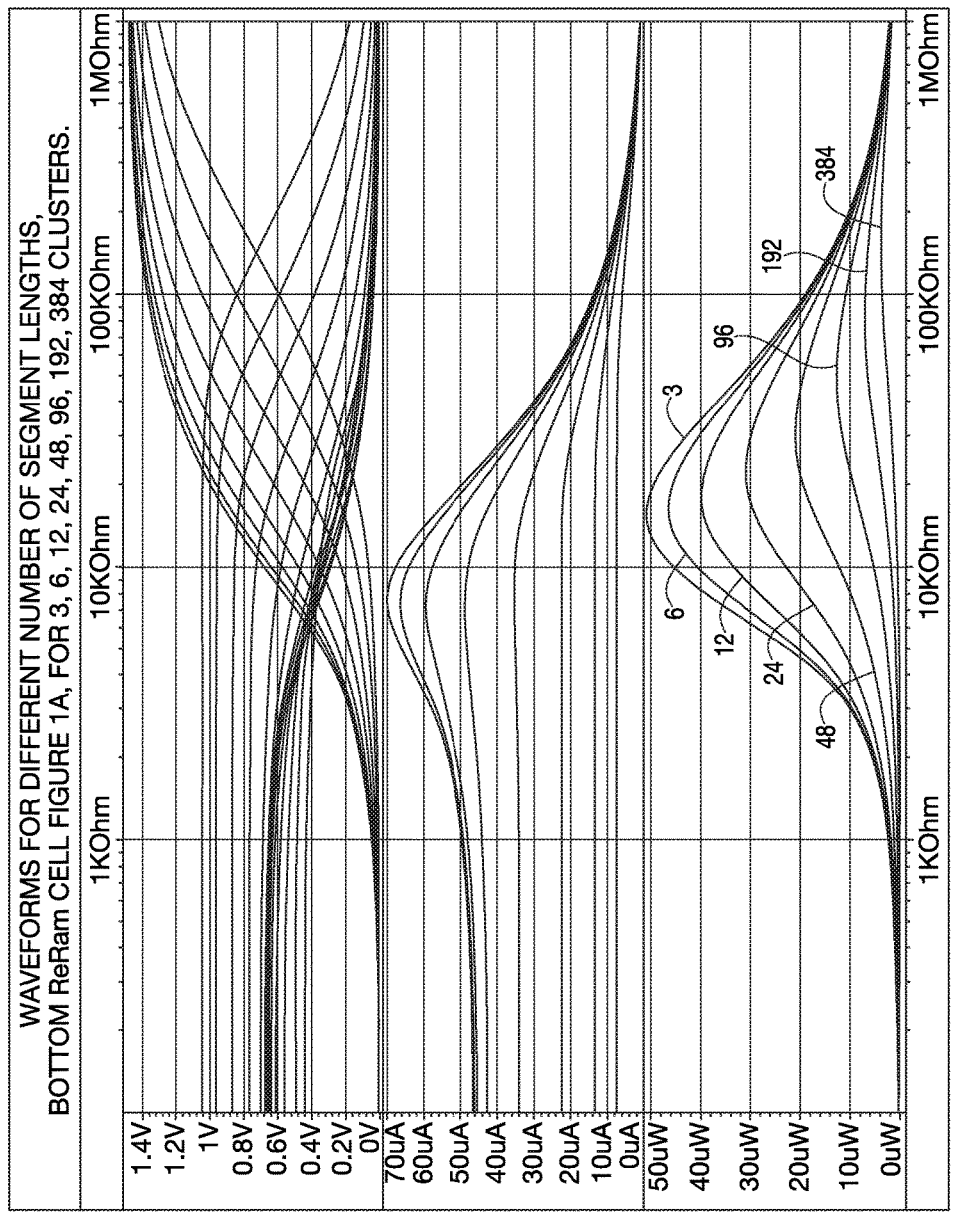

CIRCUITS AND METHODS FOR PREVENTING OVER-PROGRAMMING OF RERAM-BASED MEMORY CELLS

BACKGROUND

The present invention relates to semiconductor memory cells and arrays. More particularly, the present invention relates to resistive random-access memory (ReRAM) cells and arrays and to circuits and methods for preventing over-programming of ReRAM memory cells and arrays of ReRAM memory cells.

ReRAM cell programming comes with the risk of over-programming ReRAM cells to an on resistance ($R_{on}$) level, which is too low to adequately re-erase them. Programming of ReRAM cells usually starts from an erased state where the ReRAM device has a high off resistance ($R_{off}$) in about the 1-10 GOhm range and should decrease the ReRAM resistance to a lower resistance $R_{on}$ state, which can ideally be in about the 100 KOhm range. The programming speed depends on the power applied to the ReRAM device (the product of voltage across and current flowing through the ReRAM device).

FIG. 1A shows a four-column portion of a row of a typical ReRAM array (shown within dashed lines 10) along with typical segment circuits used to erase and program a bit-line with push-pull ReRAM cells each having a top ("Top") and a bottom ("Bot") ReRAM device. The segment circuits include an n-segment (shown within dashed lines 12) and a p-segment (shown within dashed lines 14). While FIG. 1 shows the segment circuits in use with a three-transistor ReRAM cell, persons of ordinary skill in the art will appreciate that the scheme of FIG. 1 is applicable to other push-pull ReRAM cell arrangements.

The row of the array is disposed between two lines VB and GB, designated by reference numerals 16 and 18, respectively, which are sometimes referred to as complementary bit lines. A bit line BL, one for each row of the array indicated by reference numeral 20, runs in the row direction of the array. The VB and GB lines 16 and 18 n-segment circuit 12, the p-segment circuit 14, and the bit line BL 20 are all formed from interconnect metal lines on the integrated circuit containing the ReRAM array 10 and as such have a characteristic resistance associated with them. The resistance from the n-segment end of the VB line 14 through the array 10 is represented by resistor RVBN at reference numeral 22. The resistance from the n-segment end of the bitline BL line 20 through the array 10 is represented by resistor RBLN at reference numeral 24. The resistance from the n-segment end of the GB line 18 through the array 10 is represented by resistor RGBN at reference numeral 26. The resistance from the p-segment end of the VB line 14 through the array 10 is represented by resistor RVBP at reference numeral 28. The resistance from the p-segment end of the bitline BL line 20 through the array 10 is represented by resistor RBLP at reference numeral 30. The resistance from the p-segment end of the GB line 18 through the array 10 is represented by resistor RGBP at reference numeral 32.

The VB, GB and BL bit-lines 16, 18, and 20 are driven to the potential at $V_{SS}$ line 34 (typically 0V) by pull-down n-channel MOS devices at the n-segment side 12 of the array. Thus the VB line 16 is pulled down to the potential at the $V_{SS}$ line 34 by transistors 38. The GB line 18 is pulled down to the potential at the $V_{SS}$ line 34 by transistors 40. The BL line 20 is pulled down to the potential at the $V_{SS}$ line 34 by transistors 42.

The VB, GB and BL bit-lines 16, 18, and 20 are driven to the potential at $V_{PP}$ line 36 by pull-up p-channel MOS devices at the p-segment side 14 of the array 10, where $V_{PP}$ is the bit-line programming-voltage (e.g. 1.8V). Thus the VB line 16 is pulled up to the potential at the $V_{PP}$ line 36 by transistors 44. The GB line 18 is pulled up to the potential at the $V_{PP}$ line 36 by transistors 46. The BL line 20 is pulled up to the potential at the $V_{PP}$ line 36 by transistors 48.

Depending on the operation, erasing the ReRAM device labeled TOP or BOT or programming the TOP or BOT ReRAM device, the VB, GB and BL bit-lines 16, 18, and 20 are driven either to $V_{SS}$ 34 or $V_{PP}$ 36 from one or the other of the n-channel and p-channel sides 12 and 14. Persons of ordinary skill in the art will appreciate that FIG. 1A shows an example with four three-transistor push-pull ReRAM cells, but these lines are much longer, and can be thousands of cells wide.

FIG. 1A shows all of the n-channel and p-channel pull-down and pull-up devices as two serial-connected devices. This is necessary in embodiments where these devices are the same type as the lower voltage transistors used inside the push-pull-cells, in order to avoid BVDSS problems at 1.8V programming and erase potentials. Persons of ordinary skill in the art will appreciate that where high-voltage transistors that can withstand the $V_{PP}$ potential are used for transistors 38, 40, 42, 44, 46, and 48, only single transistors may be employed.

Pulldown n-channel transistors 38 are controlled by VBS0=1 at their gates if VB 16 needs to be pulled down to $V_{SS}$. Pulldown n-channel transistors 40 are controlled by GBS0=1 at their gates if GB 18 needs to be pulled down to $V_{SS}$. Pulldown n-channel transistors 42 are controlled by BLS0=1 at their gates if BL 20 needs to be pulled down to $V_{SS}$.

Similarly, pull-up p-channel transistors 44 are controlled by VBS1_B=0 at their gates if VB 16 needs to be pulled up to $V_{PP}$. Pull-up p-channel transistors 46 are controlled by GBS1_B=0 at their gates if GB 18 needs to be pulled up to $V_{PP}$. Pull-up p-channel transistors 48 are controlled by BLS1_B=0 at their gates if BL 20 needs to be pulled up to $V_{PP}$.

As may be seen from an examination of FIG. 1A, array 10 also includes a word line (WL) 50 for each column and n-word lines (WLN) 52 and p-word lines (WLP) 54 that are shared by adjacent columns in the particular arrangement shown in FIG. 1A. The WL, WLP, and WLN word lines 50, 52, and 54 are used in programming the individual push-pull ReRAM memory cells (one of which is shown within dashed lines 56 in FIG. 1) in the array 10.

FIG. 1B is a graph showing simulated voltages and currents encountered during programming and erasing ReRAM devices in the ReRAM cells depicted in FIG. 1A. The simulation-waveforms of FIG. 1B show voltages (top waveforms), currents (center-waveforms) and power (bottom waveforms) as a function of ReRAM resistance on the X-axis on logarithmic scale in units of KOhms ranging from 100 Ohm at the left side to 1 MOhm at the right side. The bundles of 8 waveforms reflect 8 different segment length cases from 3 to 384 clusters in width, each cluster including 96 columns which range from 3*96=288 columns to 384*96=36864 columns in width. The number of columns matches the number of cells, connected to the same bit-lines. The individual waveforms differ because of the amount of metal-resistance on bit-lines, which is directly related to segment width.

Reading from right to left, programming starts slowly after applying proper bit-line voltages and selecting proper word-lines to apply that voltage across the selected ReRAM devices. If programming starts from an erased state where the ReRAM device has a high $R_{off}$, the voltage across ReRAM (top curves) is full-rail $V_{PP}$, the initial current (middle curves) is very low, and the consumed power (bottom curves) is low due to the low current. Roughly in the 1 MOhm to 100 KOhm range of this example, the increasing current causes metal-line and select-device-IR-drop to increase, and the voltage across the ReRAM device drops in tandem with increasing currents in the >10 uA range. As can be seen from FIG. 1B, power-peaks are visible in the 5-50 KOhm range. Where the power-peak appears, programming (the change of $R_{on}$) occurs very rapidly and is difficult to stop before $R_{on}$ saturates after the power-peak, perhaps in the 1 KOhm range. The circuit shown in FIG. 1A can cause ReRAM devices to be programmed to an unacceptably low value of $R_{on}$.

An undesirable consequence of programming ReRAM cells to such low values of $R_{on}$ is that it is difficult to later re-erase them if they need to be re-programmed. At an $R_{on}$ range in the region of about 1 KOhm, it is difficult to get enough voltage to the ReRAM device at high enough currents to start the erase process.

Accordingly, a challenge is how to limit the ReRAM programming to a much higher $R_{on}$ level, perhaps in the 100 KOhm range, which allows ReRAM cells to be re-erased later, if needed.

SUMMARY

A method for preventing over-programming of resistive random access (ReRAM) based memory cells in a ReRAM memory array includes applying a programming voltage in a programming circuit path including a ReRAM memory cell to be programmed, sensing programming current drawn by the ReRAM cell while the programming voltage is applied across the memory cell, and decreasing the programming current as a function of a rise in programming current.

According to one aspect of the present invention negative feedback-passgate-devices are inserted in between pull-up and pulldown-devices providing programming voltage and the bit-lines, in parallel with erase-mode-bypass-devices. In erase mode the erase mode bypass devices are activated. In programming modes the erase mode bypass devices are turned off and the feedback passgate devices limit programming current as a function of an IR drop across one or more bit lines carrying programming current to at least one ReRAM cell being programmed.

According to another aspect of the present invention negative feedback-passgate-devices are inserted in between the pull-up and pulldown-devices and the bit-lines, in parallel with erase-mode bypass devices. In addition, a number of serially-connected MOS transistor voltage threshold ($V_t$) drops are inserted in the feedback-paths. The total number of $V_t$ drops plus one should be smaller than $V_{PP}$, so that initially the feedback-passgates are on, when the current is initially still very low. The feedback-pass-gate resistance is increased, meaning that the IR-drop shows up earlier, but more importantly it takes a much smaller IR-drop to shut the feedback-path-gates off below the pass-gate $V_t$ to stop programming while the ReRAM device being programmed remains at a higher $R_{on}$.

According to yet another aspect of the present invention, instead of inserting $V_t$ drops in the feedback-path, a buffer can be inserted in the feedback path. According to this aspect of the present invention, the buffer output flips at a preselected buffer-trip-point and the programming operation stops immediately as the feedback-path-gates are shut off entirely to Vgs=0V. The buffer trip point can be set by proper buffer-device-sizing.

BRIEF DESCRIPTION OF THE DRAWINGS

The invention will be explained in more detail in the following with reference to embodiments and to the drawing in which are shown:

FIG. 2B is a graph showing the voltages and currents encountered during programming and erasing ReRAM devices in the ReRAM cells depicted in FIG. 2A;

DETAILED DESCRIPTION

Persons of ordinary skill in the art will realize that the following description of the present invention is illustrative only and not in any way limiting. Other embodiments of the invention will readily suggest themselves to such skilled persons.

Figure 2A:
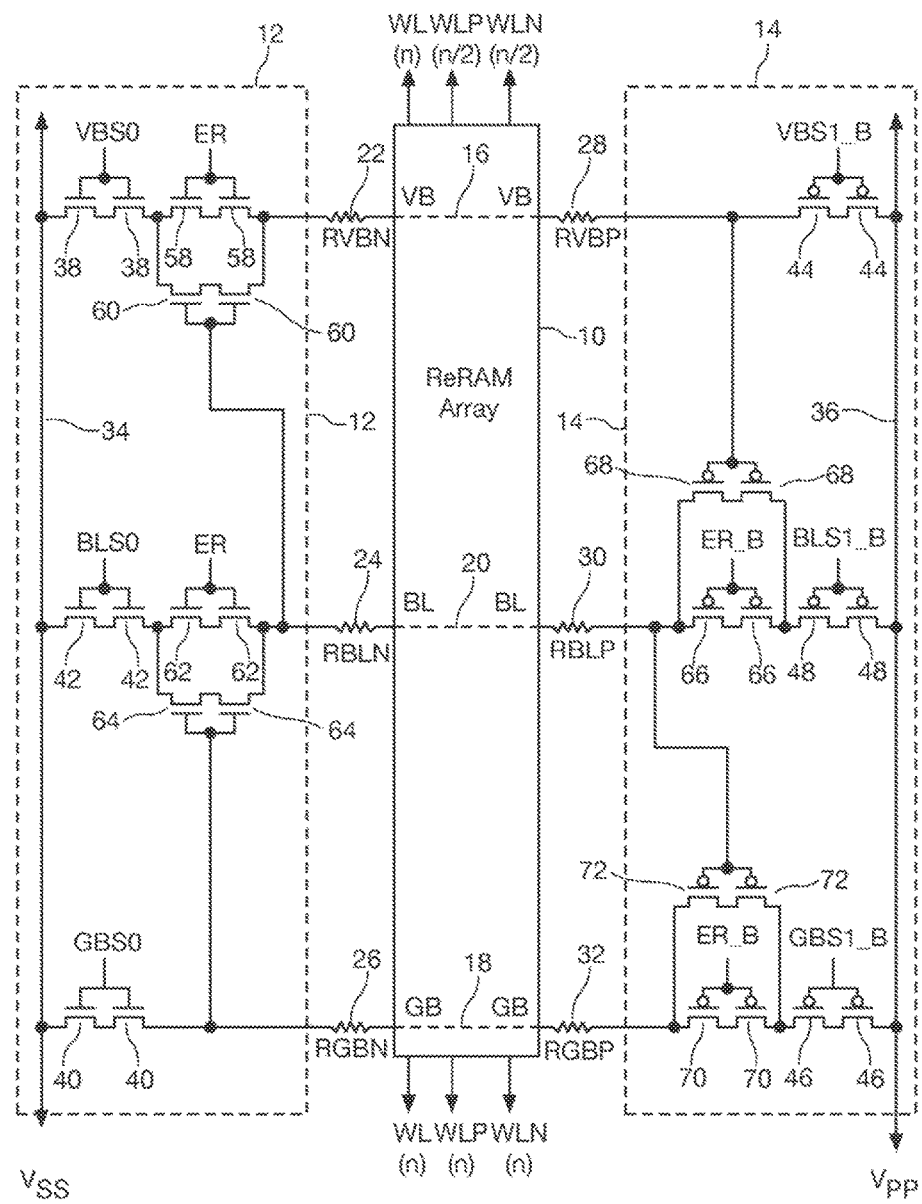
FIG. 2A is a diagram showing a push-pull memory cell ReRAM array along with segment circuits used to erase and program a bit-line in accordance with an aspect of the present invention.

Referring now to FIG. 2A diagram shows a typical push-pull memory cell ReRAM array 10 along with n-segment an p-segment circuits 12 and 14 used to erase and program the push-pull ReRAM cells including feedback devices in accordance with the present invention.

The first invention is to insert feedback-pass-gate-devices in between the pull-up and pulldown devices and the VB, GB, and BL bit-lines 16, 18, and 20, in parallel with erase-mode-bypass devices. Thus, on the n-segment side 12, erase mode bypass n-channel transistors 58 connected in series with n-channel transistors 38 to VB line 16 are shunted by a feedback-pass-gate formed from n-channel transistors 60. Erase mode bypass n-channel transistors 62 connected in series with n-channel transistors 42 connected to BL line 20 are shunted by a feedback-pass-gate formed from n-channel transistors 64.

On the p-segment side 14, erase mode bypass p-channel transistors 66 connected in series with p-channel transistors 48 connected to BL line 20 are shunted by a feedback-pass-gate formed from p-channel transistors 68. Erase mode bypass p-channel transistors 70 connected in series with p-channel transistors 46 to GB line 18 are shunted by a feedback-pass-gate formed from p-channel transistors 72.

In erase mode, ER=1 turns on the n-channel erase mode bypass devices 58 and 62 in n-segment 12 and ER_B=0 turns on the p-channel erase mode bypass devices 66 and 70 in p-segment 14. In programming modes, ER=0 turns off the n-channel erase mode bypass devices 58 and 62 in n-segment 12 and ER_B=1 turns off the p-channel erase mode bypass devices 66 and 70 in p-segment 14.

The feedback-passgates are controlled by other bit-lines. The feedback-pass-gate formed from n-channel transistors 60 connected to VB 16 in n-segment 12 is controlled by BL 20 to which their gates are connected. The feedback-pass-gate formed from n-channel transistors 64 connected to BL 20 in n-segment 12 is controlled by GB 18 to which their gates are connected.

The feedback-pass-gate formed from p-channel transistors 68 connected to BL 20 in p-segment 14 is controlled by VB 16 to which their gates are connected. The feedback-pass-gate formed from p-channel transistors 72 connected to GB 18 in p-segment 14 is controlled by BL 20 to which their gates are connected.

When the Top (Top) ReRAM device in a cell is being erased. BL 20 is driven to $V_{SS}$ and VB 16 is driven to $V_{PP}$. The erase mode bypass devices are all turned on. GB 18 is also driven to VSS, but this is not the high-current path. Both high-current-paths are through the n-channel erase mode bypass devices 62, pull-down devices 42 and pull-up devices 44.

When the Bottom (Bot) ReRAM device in a cell is being erased, GB 18 is driven to $V_{SS}$ and BL 20 is driven to $V_{PP}$. The erase mode bypass devices are all turned on. VB 16 is also driven to $V_{PP}$, but this is not the high-current path. Both high-current-paths are through the p-channel erase mode bypass devices 66, pull-down devices 40 and pull-up devices 48.

When the Top (Top) ReRAM device in a cell is being programmed, VB 16 is driven to $V_{SS}$ and BL 20 is driven to $V_{PP}$. The erase mode bypass devices are all turned off. GB 18 is also driven to $V_{SS}$, but this is not the high-current path. Both high-current paths are through the n-channel feedback-passgates 60 and the p-channel feedback-passgates 68, pull-down devices 38 and pull-up devices 48. Initially, when programming starts from high $R_{off}$, there is no high current flowing and the full voltage is seen by the cells to be programmed. As the cells program and their resistance begins to fall, the currents become high, and the metal-IR-drop increases, which shows up at the two high-current bit-lines on the opposite side from the active pull-up or pull-down devices, whereby there is more or less IR-drop at one or the other side, depending on the cell location within the row, since the metal is longer or shorter on one side or the other. For example, if the selected cell is at the far left near n-segment 12, most metal-IR-drop occurs along BL 20 through its resistance component RBLP 30, and the voltage is lower at the n-segment 12 side, which controls the gates of the n-channel pass-gate transistors 60 connected between $V_{SS}$ and VB 16. When this JR-drop occurs, the voltage at the gates of n-channel transistors 60 decreases because of the IR drop in resistor RBLP 30 (the length of BL 20). The decreased gate drive increases the resistance of n-channel passgate transistors 60.

While in this example with the cell at far left, the metal resistance RVBN is negligible and doesn't contribute much IR-drop, the increasing resistance of the feedback-pass-gate 60 causes an IR drop to VB 16 that decreases the voltage at the gates of p-channel passgate transistors 68. The decreased gate drive increases the resistance of p-channel passgate transistors 68. As the IR drop increases with increasing programming current, the negative feedbacks accelerate the IR-drop at the ReRAM cell being programmed from both sides, which eventually stops the programming operation.

Persons of ordinary skills in the art will realize that during programming of a cell located at the far right, the feedback mechanism will be dominated by RVBN over feedback-pass-gate 68 to feedback-pass-gate 60, while RBLP is negligible. Such skilled persons will also realize that during programming of a cell located somewhere near the center, both RBLP and RVBN will trigger the feedback more equally and simultaneously over both feedback-passgates 60 and 68.

When the Bottom (Bot) ReRAM device in a cell is being programmed, BL 20 is driven to $V_{SS}$ and GB 18 is driven to $V_{PP}$. VB 16 is also driven to $V_{PP}$, but this is not the high-current path. Both high-current paths are through the n-channel feedback-passgates 64 and the p-channel feedback-passgates 72, pull-down-devices 42 and pull-up devices 46. The feedback mechanism is similar to the case where the Top ReRAM device is being programmed, in that the IR drop caused by the resistance of the GB 16 and BL 20 lines causes the gate voltage of the n-channel feedback-passgates 64 and the p-channel feedback-passgates 72 to drop, increasing their resistance and limiting the current passing through them.

Figure 1A:
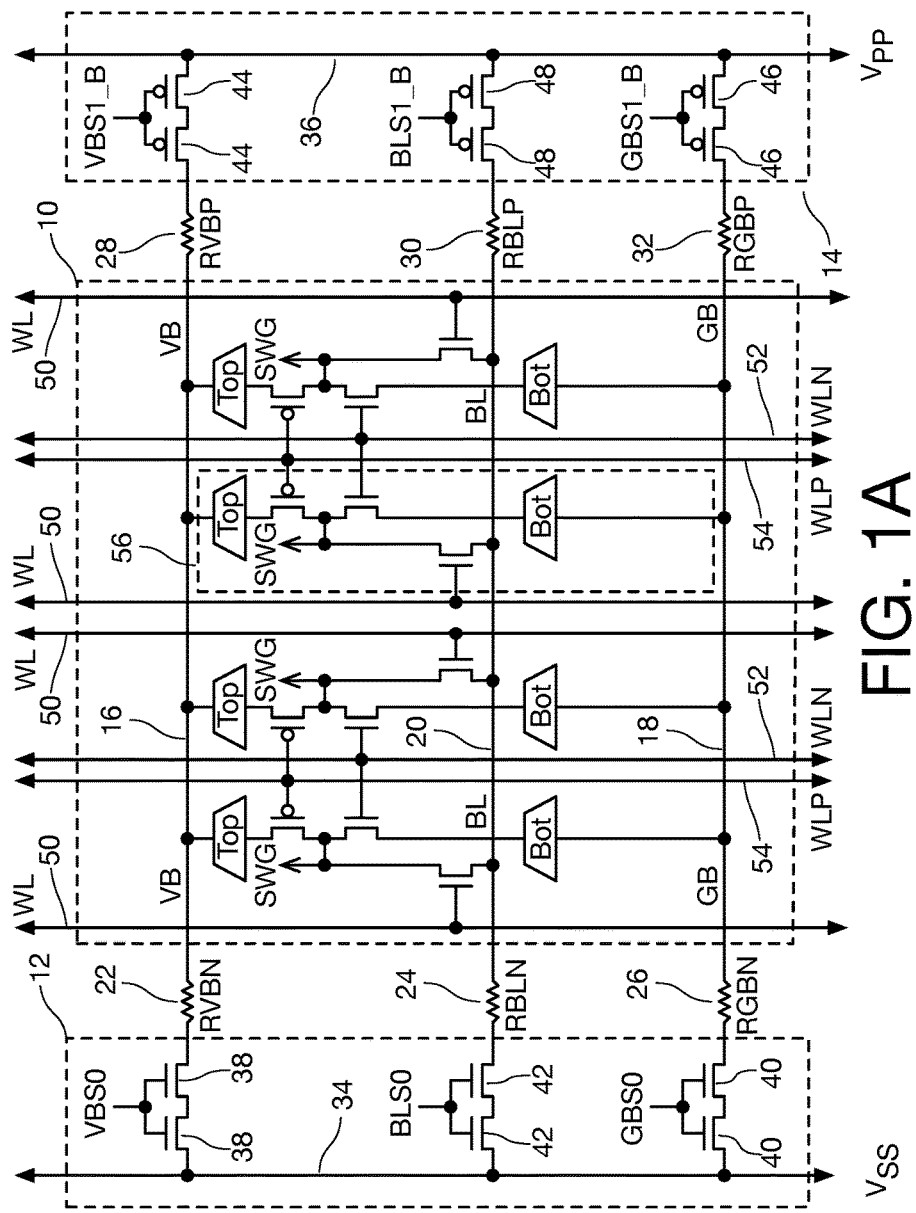
FIG. 1A is a diagram showing a typical prior-art push-pull memory cell ReRAM array along with typical segment circuits used to erase and program a bit-line.
Figure 1B:
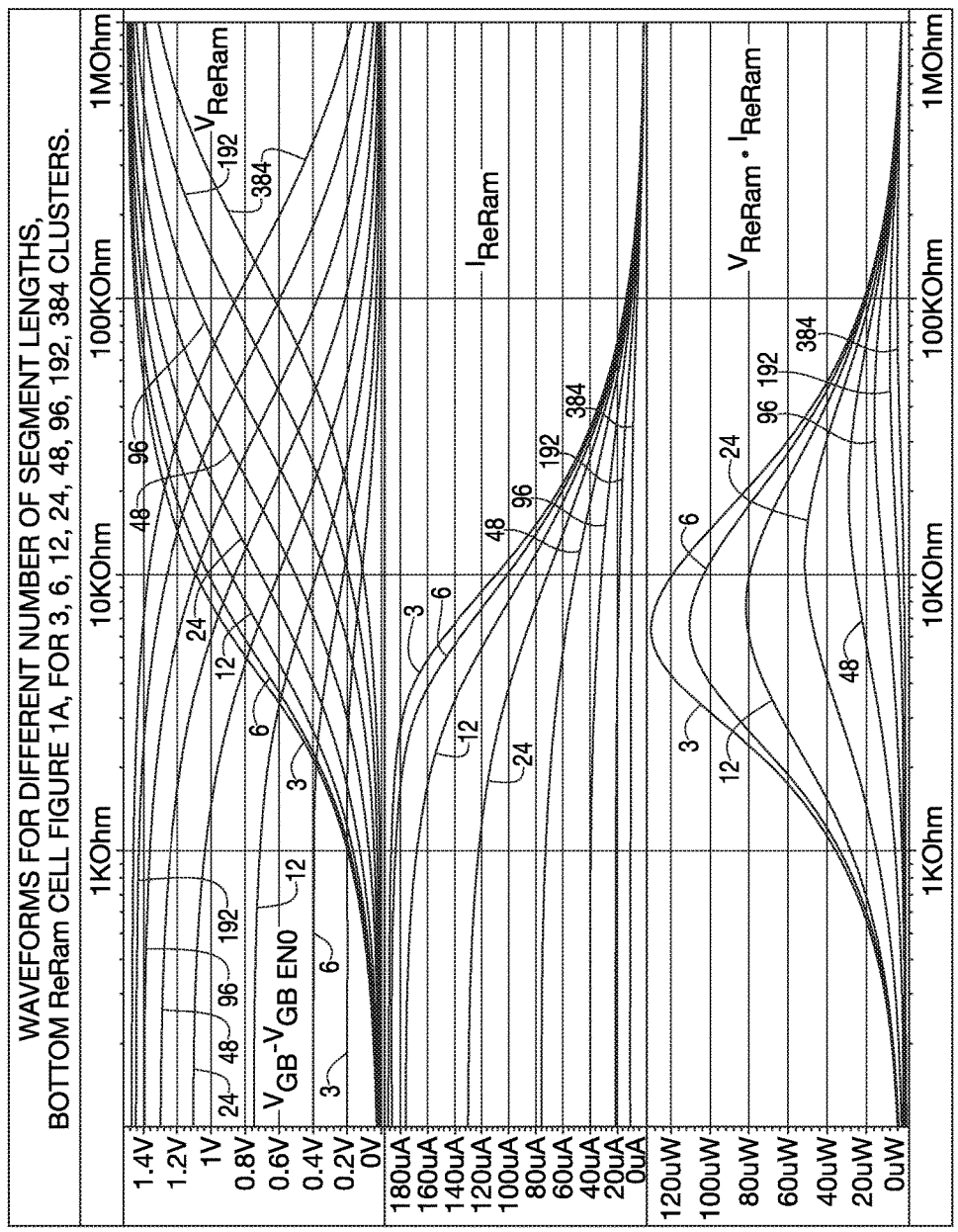
FIG. 1B is a graph showing the voltages and currents encountered during programming and erasing ReRAM devices in the ReRAM cells depicted in FIG. 1A.

Comparing the waveforms of the graphs of FIG. 2B with the graphs of FIG. 1B, it can be seen that the power-peak both shifts towards the right and sharpens at the left. This results in the termination of the programming operation at a ReRAM device value of $R_{on}$ that is higher than would be the case if the present invention was not employed.

Figure 3A:
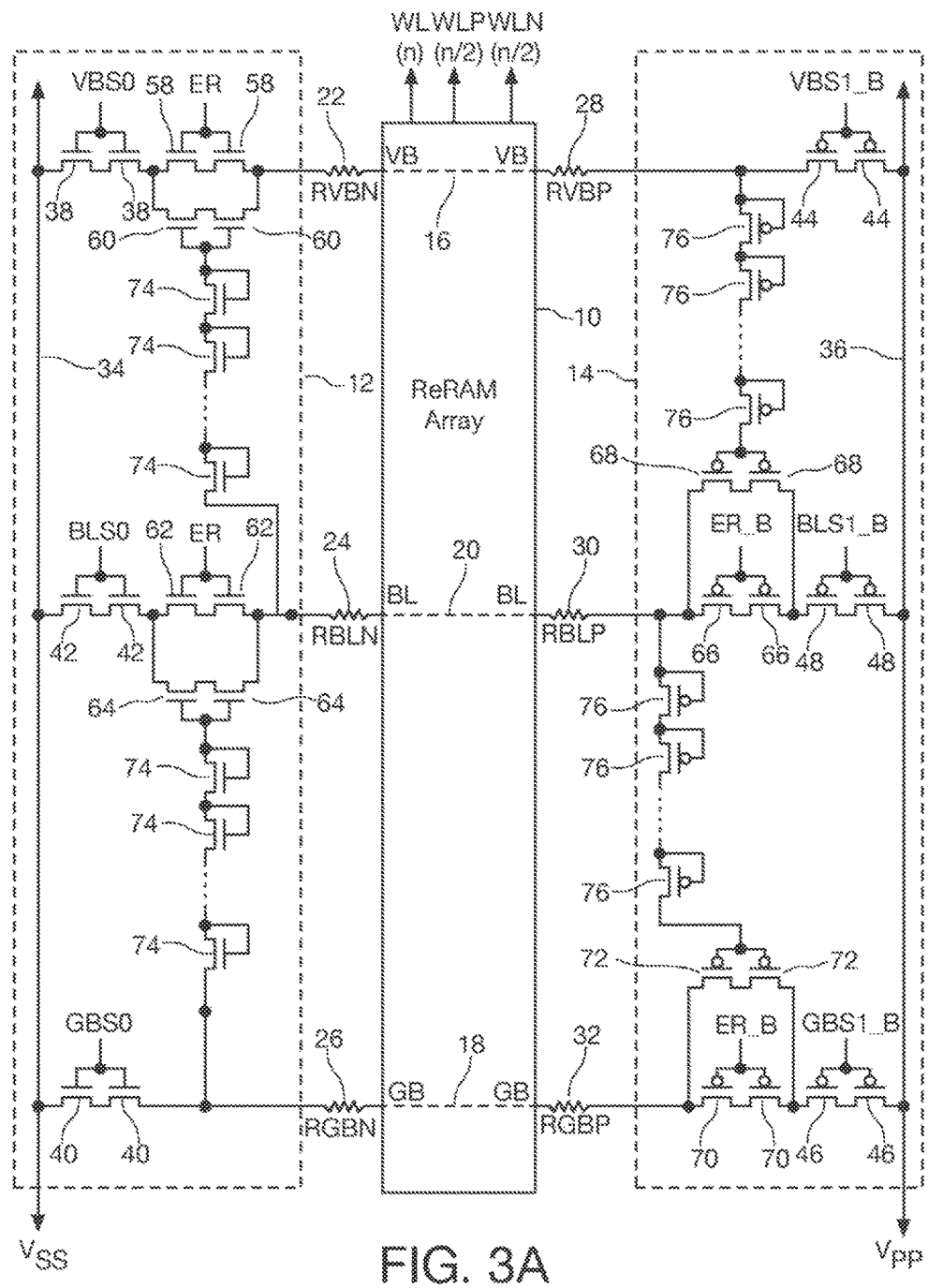
FIG. 3A is a diagram showing a push-pull memory cell ReRAM array along with segment circuits used to erase and program a bit-line in accordance with an aspect of the present invention.

Referring now to FIG. 3A, a diagram shows a push-pull memory cell ReRAM array along with segment circuits used to erase and program a bit-line in accordance with an aspect of the present invention in which a number of $V_t$ voltage dropping devices are placed in the gates circuits of the n-channel passgate transistors 60 and 64 and the p-channel passgate transistors 68 and 72. Each $V_t$ voltage dropping device 74 in the n-segment 12 includes a diode-connected n-channel transistor. Each $V_t$ voltage dropping device 76 in the n-segment 14 includes a diode-connected p-channel transistor. As will be appreciated by persons of ordinary skill in the art, the number of such devices 74 and 76 to be used in any embodiment of the invention depends on the process technology as well as the $V_{PP}$ voltage level used.

The total number of VT-drops plus one should be smaller than $V_{PP}$, so that initially the feedback-passgates are ON, when the current is initially still very low. The feedback-pass-gate resistance is increased, causing the IR-drop to show up earlier, but more importantly it takes a much smaller IR-drop to shut the feedback-path-gates off below the pass-gate-$V_t$ to stop programming at a higher $R_{on}$.

Figure 3B:
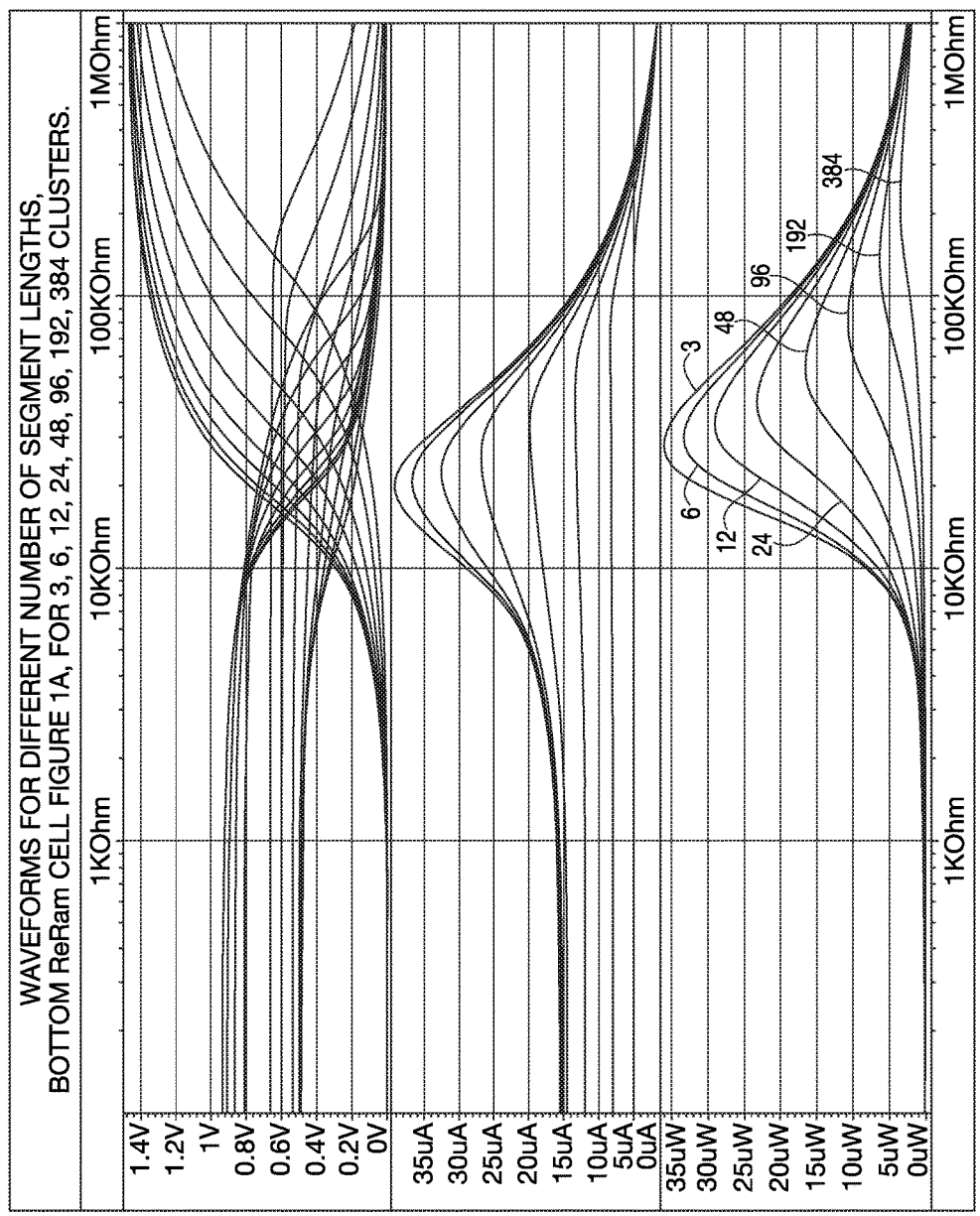
FIG. 3B is a graph showing the voltages and currents encountered during programming and erasing ReRAM devices in the ReRAM cells depicted in FIG. 3A.

FIG. 3B is a graph showing the voltages and currents encountered during programming and erasing ReRAM devices in the ReRAM cells depicted in FIG. 3A. As a result of using the circuit shown in FIG. 3A, the power-peaks shift further right and sharpen at the left side of the waveform further, even though in the simulation resulting in the graphs of FIG. 3B the number of $V_t$-drops (three) was not maximized.

Figure 4:
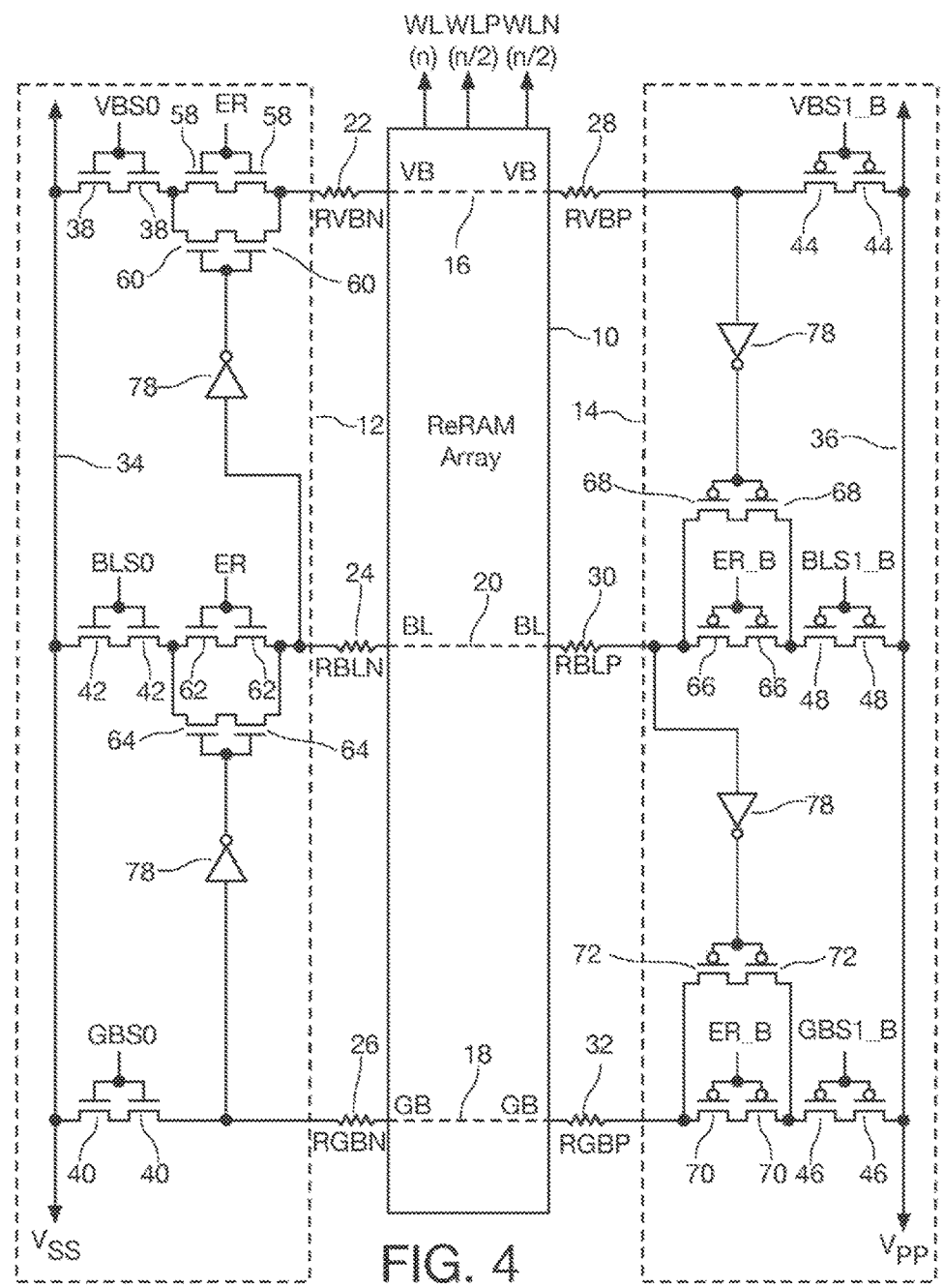
FIG. 4 a diagram showing a push-pull memory cell ReRAM array along with segment circuits used to erase and program a bit-line in accordance with an aspect of the present invention.

In accordance with yet another aspect of the present invention, instead of inserting $V_t$-drops in the feedback-path, alternatively buffers can be inserted in the feedback path. This aspect of the invention is illustrated in FIG. 4. According to the aspect of the invention shown in FIG. 4, the gates of the n-channel passgate transistors 60 and 64 and the p-channel passgate transistors 68 and 72 are driven through buffers 78. The buffers 78 are configured so that the buffer-output flips at a selected buffer-trip-point, which can be determined by proper buffer-device-sizing and the programming operation stops immediately as the feedback-path-gates are shut off entirely to Vgs=0V.

As will be appreciated by persons of ordinary skill in the art, the aspects of the invention depicted in FIGS. 2A, 3A and 4 can be further combined. Two serial feedback-pass-gates can be provided, a first one having $V_t$-drops to accelerate the IR-drops as much as possible, combined with a second one using buffers. This provides the advantage of employing buffer-feedback to shut down the pass-gate entirely.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method for preventing over-programming of resistive random access (ReRAM) memory cells in a ReRAM memory array comprising:
   applying a programming voltage in a programming circuit path including a ReRAM memory cell to be programmed;
   sensing programming current drawn by the ReRAM memory cell while the programming voltage is applied across the ReRAM memory cell by sensing a voltage drop in a bit line in the memory array, the bit line being in the programming circuit path; and
   increasing a resistance of a circuit element in the programming path as a function of the rise in programming current by reducing a gate drive voltage to at least one MOS transistor in the programming path by an amount that is a function of the voltage drop.

2. The method of claim 1 further comprising reducing the gate drive voltage to the at least one MOS transistor by a voltage equal to an integral number of MOS transistor voltage threshold drops.

3. The method of claim 2 wherein a total number of MOS transistor voltage threshold drops plus one is less than the programming voltage.

4. The method of claim 1 further comprising providing in a circuit providing the gate drive a buffer having a buffer-trip-point selected to terminate gate drive to the at least one MOS transistor in the programming path at a gate drive voltage that is a function of a predetermined level of programming current.

5. A circuit for preventing over-programming of resistive random access (ReRAM) memory cells in a ReRAM memory array comprising:
   a programming circuit path for applying a programming voltage to a ReRAM memory cell to be programmed;
   a bit line in the memory array through which programming current flows, the bit line having a bit line resistance, the bit line sensing programming current drawn by the ReRAM cell while the programming voltage is applied across the memory cell; and
   at least one MOS transistor disposed in the programming path, the at least one MOS transistor having a gate coupled to the bit line at a location to cause a gate voltage applied to the at least one MOS transistor that decreases as a function of increased current flow through the bit line.

6. The circuit of claim 5 further comprising a plurality of diode-connected MOS transistors coupled in series to the gate of the at least one MOS transistor.

7. The circuit of claim 6 where each of the diode-connected MOS transistors has a MOS transistor voltage threshold drop and a total voltage drop across the plurality of diode-connected MOS transistors voltage drop plus one MOS transistor voltage threshold drop is less than the programming voltage.

8. The circuit of claim 5 further comprising a buffer coupled in series to the gate of the at least one MOS transistor, the buffer having a buffer-trip-point selected to terminate gate drive to the at least one MOS transistor in the programming path at a gate drive voltage that is a function of a predetermined level of programming current.

* * * * *